United States Patent
Hashimoto

(10) Patent No.: US 7,825,666 B2
(45) Date of Patent: Nov. 2, 2010

(54) TEST APPARATUS AND MEASUREMENT APPARATUS FOR MEASURING AN ELECTRIC CURRENT CONSUMED BY A DEVICE UNDER TEST

(75) Inventor: Yoshihiro Hashimoto, Saitama (JP)

(73) Assignee: Advantest Corporation, Tokyo (JP)

( * ) Notice: Subject to any disclaimer, the term of this patent is extended or adjusted under 35 U.S.C. 154(b) by 0 days.

(21) Appl. No.: 12/233,614

(22) Filed: Sep. 19, 2008

(65) Prior Publication Data
US 2009/0121726 A1 May 14, 2009

Related U.S. Application Data

(63) Continuation-in-part of application No. 11/936,799, filed on Nov. 8, 2007, now abandoned.

(51) Int. Cl.
*G01R 31/08* (2006.01)
*G01R 31/26* (2006.01)

(52) U.S. Cl. ........................ 324/522; 324/765
(58) Field of Classification Search ................. 324/522, 324/765
See application file for complete search history.

(56) References Cited

U.S. PATENT DOCUMENTS

| | | | | |
|---|---|---|---|---|
| 4,710,704 A | * | 12/1987 | Ando | 324/103 R |
| 5,479,130 A | * | 12/1995 | McCartney | 327/341 |
| 6,087,843 A | * | 7/2000 | Pun et al. | 324/765 |
| 7,005,867 B2 | * | 2/2006 | Hashimoto | 324/713 |
| 7,132,844 B2 | * | 11/2006 | Hashimoto | 324/765 |

\* cited by examiner

*Primary Examiner*—Amy He
(74) *Attorney, Agent, or Firm*—Osha Liang LLP

(57) ABSTRACT

There is provided a test apparatus for testing a device under test, which includes a voltage supplying section that supplies a voltage to the device under test through a wire, a first capacitor that is arranged between the wire and a common potential in series, a current detecting section that detects a current flowing through the wire at a location closer to the device under test than the first capacitor is, an integrating section that outputs an integration value obtained by integrating a difference between the current detected by the current detecting section and a predetermined reference current, and a judging section that judges whether the device under test is a pass or a failure based on the integration value.

14 Claims, 17 Drawing Sheets

TEST APPARATUS AND MEASUREMENT APPARATUS FOR MEASURING AN ELECTRIC CURRENT CONSUMED BY A DEVICE UNDER TEST

CROSS REFERENCE TO RELATED APPLICATION

This is a continuation in-part application of Ser. No. 11/936,799 filed on Nov. 8, 2007 now abandoned, the contents of which are incorporated herein by reference.

BACKGROUND

1. Technical Field

The present invention relates to a test apparatus and a measurement apparatus. Particularly, the present invention relates to a test apparatus and a measurement apparatus for measuring an electric current consumed by a device under test (load).

2. Related Art

A test apparatus has a function of measuring an average current to be consumed by a device under test when the device operates. The test apparatus detects a current output from a power source device that supplies a drive voltage to the device under test, and measures the average current consumed by the device under test.

Here, the power source device is slow in responding to any change in the current consumed by the load. Accordingly, the test apparatus has a bypass capacitor having relatively large capacitance, between its power source line and the ground, in order to compensate for any response delay of the current output from the power source device. With this, the test apparatus can supply a drive current to the device under test even in a case where it makes the device under test operate in such a manner as would require the current consumed by the device under test to change quickly.

Here, in a case where the test apparatus has a bypass capacitor, the current to be consumed by the device under test and the current output from the power source device do not coincide. Hence, the test apparatus cannot correctly measure the average current consumed by the device under test, by detecting the output current from the power source device.

Thus, a conceivable test apparatus to overcome this problem is such one that has, near the device under test, an AD converter which samples the drive current to be supplied to the device under test. However, since the drive current supplied to the device under test changes quickly, the test apparatus has to make the AD converter perform sampling quickly. Accordingly, the test apparatus has to be provided with a high-performance AD converter. Further, since there will be a large amount of data that should be taken in, the test apparatus has to be provided with a data memory having a large capacity.

Furthermore, in testing multiple devices under test of about several hundreds or so simultaneously, the test apparatus has to have the same number of current measuring sections as the number of devices under test. Therefore, it is preferred that the test apparatus be structured as a simple circuit in order to be able to measure the average current consumed by the device under test.

When measuring the current of the device under test, a measurement error is caused by an offset in the operating amplifier used by the measuring circuit. To solve this problem, it is necessary to adjust the offset to be equal to zero. But if a plurality of measurement channels are provided, it is necessary to adjust the offset of each channel because each operating amplifier has a different offset. To achieve this, a way to adjust the error caused by the offset automatically and with the same process is sought.

During the initial evaluation of the device under test, the value of the value of the current may be sought in addition to the test result indicating pass/fail of the current test of the device under test. Therefore, a way to easily obtain the current value is desired.

SUMMARY

Therefore, it is an object of an aspect of the innovations herein to provide a test apparatus and a measurement apparatus, which are capable of overcoming the above drawbacks accompanying the related art. The above and other objects can be achieved by combinations described in the independent claims. The dependent claims define further advantageous and exemplary combinations of the innovations herein.

According to a first aspect related to the innovations herein, one exemplary test apparatus may include a test apparatus for testing a device under test, having: a voltage supplying section which supplies a voltage to a device under test through a wire; a first capacitor which is arranged between the wire and a common potential in series; a current detecting section which detects a current flowing through the wire at a location which is closer to the device under test than the first capacitor is; an integrating section which outputs an integration value obtained by integrating a difference between the current detected by the current detecting section and a predetermined reference current; and a judging section which judges whether the device under test is a pass or a failure based on the integration value.

According to a second aspect related to the innovations herein, one exemplary measurement apparatus may include a measurement apparatus for measuring a current flowing through a load, having: a first capacitor which is arranged between a wire for supplying a voltage to the load and a common potential in series; a current detecting section which detects a current flowing through the wire at a location closer to the load than the first capacitor is; and an integrating section which outputs an integration value obtained by integrating a difference between the current detected by the current detecting section and a predetermined reference current.

According to a third aspect related to the innovations herein, one exemplary test apparatus may include the test apparatus according to the first aspect, wherein the integrating section has: an integrating circuit which stores charges corresponding to a current indicating the difference between the current detected by the current detecting section and the reference current in a capacity element, and outputs an integration voltage that occurs across both ends of the capacity element as the integration value; and an offset correcting section that corrects an offset occurring at an input of the integrating circuit.

According to a fourth aspect related to the innovations herein, one exemplary test apparatus may include the test apparatus according to the first aspect, further including an AD converting section that measures the integration value, wherein the AD converting section has: a recording section that records digital values obtained by measuring the integration value for each measurement cycle; and a processing section that scales the digital values obtained respectively for each measurement cycle recorded on the recording medium with measured values obtained when only the reference current is input before or after a series of measurements.

The above summary of the invention is not intended to list all necessary features of the present invention, but sub-combinations of these features can also provide an invention.

DESCRIPTION OF EXEMPLARY EMBODIMENTS

One aspect of the present invention will be described below through an embodiment of the invention, but the embodiment below is not intended to limit the invention set forth in the claims, or all the combinations explained in the embodiment are not necessarily essential to the means of solving provided by the invention.

Figure 1:
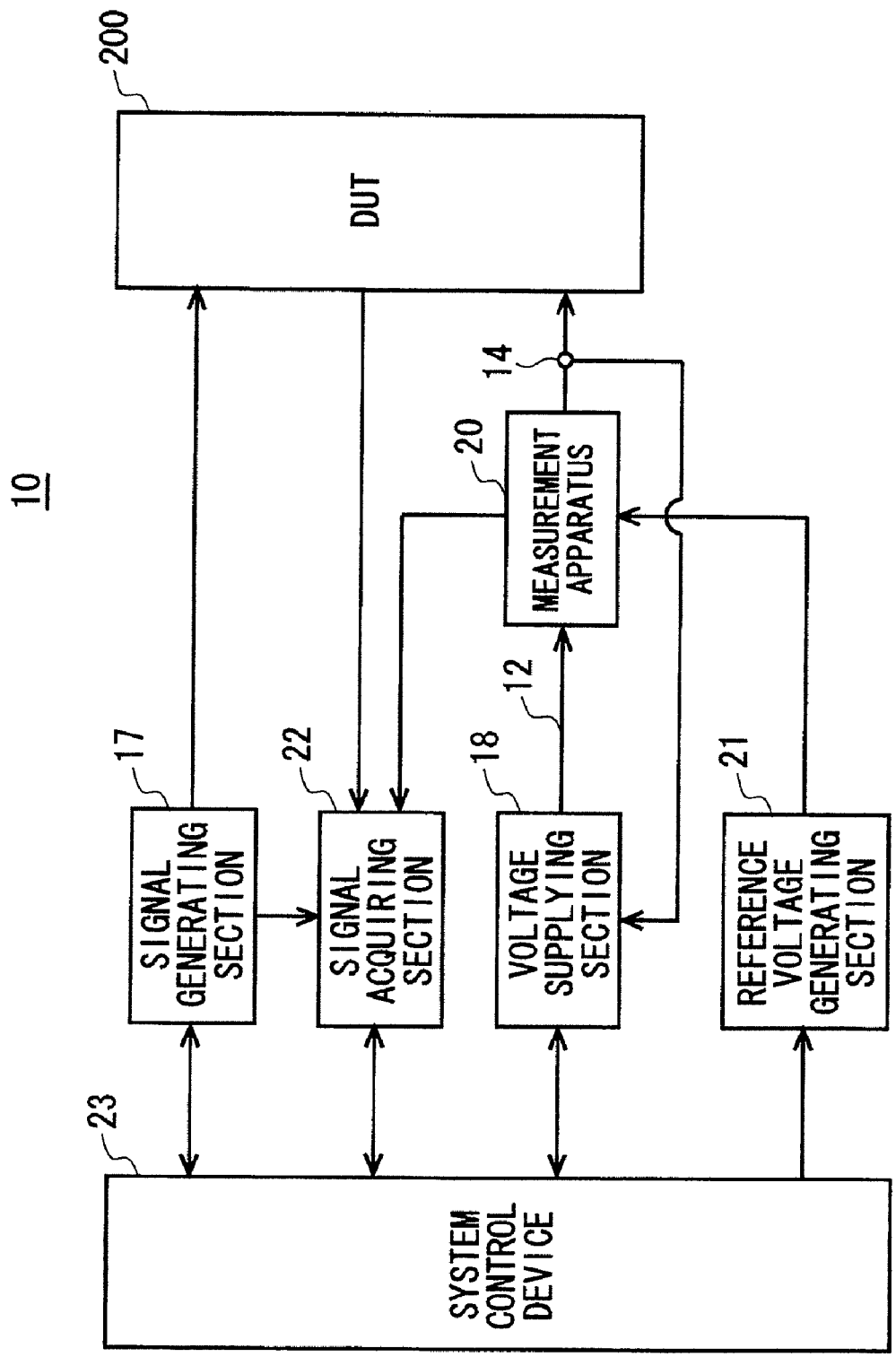
FIG. 1 shows the configuration of a test apparatus 10 according to the present embodiment, together with a device under test (DUT) 200.

FIG. 1 shows the configuration of a test apparatus 10 according to the present embodiment, together with a device under test (DUT) 200. The test apparatus 10 comprises a signal generating section 17, a voltage supplying section 18, a measurement apparatus 20, a reference voltage generating section 21, a signal acquiring section 22, and a system control device 23, and tests the DUT 200.

The DUT 200 is tested by the test apparatus 10, for example, while it is loaded on a performance board or the like. The signal generating section 17 supplies a test signal corresponding to a test pattern to the DUT 200.

The voltage supplying section 18 supplies a voltage to the DUT 200 through a wire 12. The voltage supplying section 18 may, for example, supply a voltage for driving the DUT 200, to a power source terminal of the DUT 200. The voltage supplying section 18 may, for example, detect a voltage (drive voltage Vdd) at a point (a detection end 14) on the wire 12 that is near the DUT 200 and control its output voltage such that the detected drive voltage Vdd becomes a predetermined value.

The measurement apparatus 20 measures an average consumption current of the DUT 200 (for example, an average consumption current when the DUT 200 is in operation). Then, the measurement apparatus 20 judges whether the average consumption current of the DUT 200 is larger or not (or smaller or not) than a predetermined reference current $I_{REF}$. Note that the measurement apparatus 20 may, for example, be located at a device interface section such as a socket or the like, into which the performance board and the DUT 200 are inserted.

The reference voltage generating section 21 generates a reference voltage $V_{REF}$ for generating the reference current $I_{REF}$, and supplies it to the measurement apparatus 20. The reference voltage generating section 21 supplies the reference voltage $V_{REF}$ to the measurement apparatus 20, for example, prior to a test, in accordance with the control of the system control device 23.

The signal acquiring section 22 judges whether an output signal to be output from the DUT 200 in response to a test signal is a pass or a failure. In addition, the signal acquiring section 22 judges whether the DUT 200 is a pass or a failure based on a result of judgment by the measurement apparatus 20.

The system control device 23 includes a memory which stores a program therein, a CPU which executes the program, etc. The system control device 23 exchanges data with the signal generating section 17, the voltage supplying section 18, the reference voltage generating section 21, and the signal acquiring section 22 to control the testing operation of the test apparatus 10.

Figure 2:
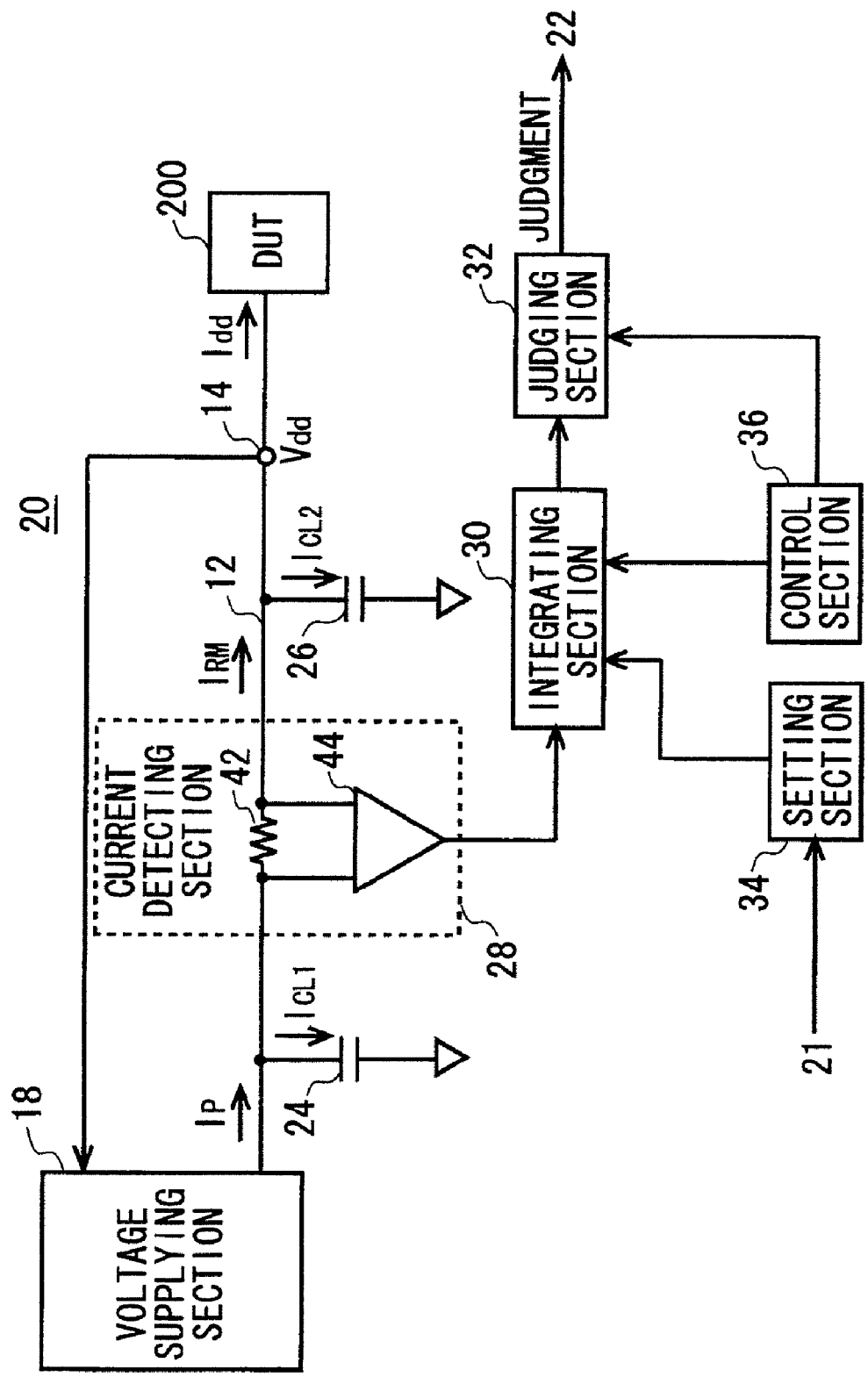
FIG. 2 shows the configuration of a measurement apparatus 20 according to the present embodiment, together with a voltage supplying section 18 and the DUT 200.

FIG. 2 shows the configuration of the measurement apparatus 20 according to the present embodiment, together with the voltage supplying section 18 and the DUT 200. The measurement apparatus 20 comprises a first capacitor 24, a second capacitor 26, a current detecting section 28, an integrating section 30, a judging section 32, a setting section 34, and a control section 36.

The first capacitor 24 is arranged between the wire 12 and a common potential in series. For example, the first capacitor 24 may be connected to the wire 12 at a location closer to the voltage supplying section 18 than the detection end 14 is. The common potential may, for example, be a ground potential, or any other reference potential. When the current to be consumed by the DUT 200 changes quickly and an output current $I_P$ from the voltage supplying section 18 lags behind in responding to that change, the first capacitor 24 can supply the DUT 200 with a current to be consumed that amounts to this change.

The second capacitor 26 is arranged between the wire 12 and the common potential in series at a location closer to the DUT 200 than the first capacitor 24 is. The second capacitor 26 may, for example, be connected to the wire 12 at a location farther from the DUT 200 than the detection end 14 is.

Further, the second capacitor 26 has smaller capacitance than the first capacitor 24. The capacitance of the second capacitor 26 may be, for example, about 1/10 to 1/1000 of the capacitance of the first capacitor 24. When a high-frequency noise such as a ripple or the like gets superimposed on the wire 12, the second capacitor 26 can drop the noise to the common potential (for example, the ground potential). Accordingly, it is preferred that the second capacitor 26 be connected to the wire 12 at a location as close to the DUT 200 as possible.

The current detecting section 28 detects a current $I_{RM}$ flowing through the wire 12, at a location that is closer to the DUT 200 than the first capacitor 24 is and farther from the DUT 200 than the second capacitor 26 is. That is, the current detecting section 28 detects the current $I_{RM}$ flowing through the wire 12 at a location between the first capacitor 24 and the second capacitor 26.

Here, since the current detecting section 28 detects the current flowing through the wire 12 at the location closer to the DUT 200 than the first capacitor 24 is, it can detect a current, which is the sum of the current supplied from the voltage supplying section 18 to the DUT 200 and the current supplied from the first capacitor 24 to the DUT 200. That is, the current detecting section 28 can detect a current that coincides with a drive current $I_{DD}$ to be supplied to the DUT 200. Accordingly, even in a case where the output voltage $I_P$ from the voltage supplying section 18 gets behind in responding to any change in the current to be consumed by the DUT 200 and hence the current to be consumed by the DUT 200 and the output current $I_P$ from the voltage supplying section 18 lose coincidence, the current detecting section 28 can correctly detect the drive current $I_{DD}$ to be supplied to the DUT 200.

Note that the second capacitor 26 likewise supplies a current to the DUT 200 when the current to be consumed by the DUT 200 changes quickly. However, since the capacitance of the first capacitor 24 is larger than that of the second capacitor 26, the current to be supplied from the first capacitor 24 to the DUT 200 is larger than the current to be supplied from the second capacitor 26 to the DUT 200 (for example, about 10 times to 1000 times larger). Accordingly, the current $I_{RM}$ flowing through the wire 12 between the first capacitor 24 and the second capacitor 26 can be said to be approximately the same as the drive current $I_{DD}$ to be supplied to the DUT 200. Thus, the current detecting section 28 can correctly detect the drive current $I_{DD}$ to be supplied to the DUT 200.

The current detecting section 28 may include, for example, a detection resistor 42 and a potential difference detecting section 44. The detection resistor 42 is arranged so as to intervene in the wire 12 at a location between the first capacitor 24 and the second capacitor 26 in series. The detection resistor 42 may be, for example, a minute resistor of about several milliohms. The potential difference detecting section 44 outputs a detection voltage $V_X$ which is proportional to the potential difference between both the ends of the detection resistor 42. Such a current detecting section 28 can output the detection voltage $V_X$ which is proportional to the current $I_{RM}$ flowing through the wire 12 between the first capacitor 24 and the second capacitor 26.

Instead of the above, the current detecting section 28 may include a coil arranged intervening in the wire 12 at a location between the first capacitor 24 and the second capacitor 26 in series, and a detecting section which detects the current flowing through that coil. Such a current detecting section 28 can also detect the current $I_{RM}$ flowing through the wire 12 between the first capacitor 24 and the second capacitor 26.

The integrating section 30 outputs an integration value obtained by integrating the difference between the current $I_{RM}$ detected by the current detecting section 28 and the predetermined reference current $I_{REF}$. For example, the integrating section 30 may store the charges that correspond to the current indicating the difference between the current $I_{RM}$ detected by the current detecting section 28 and the predetermined reference current $I_{REF}$, in any capacity element. Then, for example, the integrating section 30 may output an integration voltage that occurs across both the ends of the capacity element in which the charges are stored, as the integration value. An example of a detailed configuration of the integrating section 30 will be explained with reference to FIG. 3.

Since this integrating section 30 integrates the difference between the current $I_{RM}$ detected by the current detecting section 28 and the reference current $I_{REF}$, it will output an integration value (integration voltage) which is larger than 0 in a case where the average current of the current $I_{RM}$ is equal to or smaller than the reference current $I_{REF}$, and which is equal to or smaller than 0 in a case where the average current of the current $I_{RM}$ is larger than the reference current $I_{REF}$. Here, the current $I_{RM}$ detected by the current detecting section 28 coincides with the drive current Idd to be supplied to the DUT 200. That is, the average current of the current $I_{RM}$ coincides with the average consumption current of the DUT 200. As known from this, the integrating section 30 can output an integration value (integration voltage) which is larger than 0 when the average consumption current of the DUT 200 is equal to or smaller than the reference current $I_{REF}$ and which is equal to or smaller than 0 when the average consumption current of the DUT 200 is larger than the reference current $I_{REF}$.

The judging section 32 judges whether the DUT 200 is a pass or a failure based on the integration value output from the integrating section 30. The judging section 32 may judge whether the average consumption current of the DUT 200 is larger or not (or smaller or not) than the predetermined reference current $I_{REF}$, by, for example, comparing whether the integration value output from the integrating section 30 is larger or not (or smaller or not) than a predetermined threshold (for example, 0). The judging section 32 may, for example, output a judgment which indicates a pass (the average consumption current is equal to or smaller than the predetermined reference current $I_{REF}$) in a case where the integration value is positive, and which indicates a failure (the average consumption current is larger than the predetermined reference current $I_{REF}$) in a case where the integration value is negative.

The setting section 34 sets the integrating section 30 to be at the reference current $I_{REF}$, prior to a test. The setting section 34 may, for example, set the reference current $I_{REF}$ according to the type, grade, or the like of the DUT 200, or the content of the test on the DUT 200 or the like. This allows the measurement apparatus 20 to judge, for example, whether the average consumption current of the DUT 200 exceeds an upper limit (or falls below a lower limit) designated as the specifications of the DUT 200.

The control section 36 controls the integration period of the integrating section 30. For example, the control section 36 controls the integrating section 30 to start integrating at a test start timing and controls the integrating section 30 to terminate integrating at a test end timing.

Further, in a case where the integrating section 30 stores the charges corresponding to the current indicating the difference between the current $I_{RM}$ detected by the current detecting section 28 and the reference current $I_{REF}$ in the capacity element, the control section 36 may, prior to a test, discharge the charges stored in the current detecting section 28 in its capacity element to zero the charges from the capacity element. By doing so, the control section 36 can make a correct integration voltage be output from the integrating section 30.

Since the measurement apparatus 20 as described above stores the integration value, it has only one sampling value that should be retained and does not therefore have to have a data memory or the like. Further, this measurement apparatus 20 can correctly compare the average consumption current of the DUT 200 and the reference current $I_{REF}$ even when the current to be consumed by the DUT 200 fluctuates quickly. Furthermore, since the measurement apparatus 20 can be a simply-structured circuit to be able to measure the average consumption current of the DUT 200, a small apparatus scale will suffice even in a case where, for example, several-hundred DUTs 200 are to be tested at a time.

Figure 3:
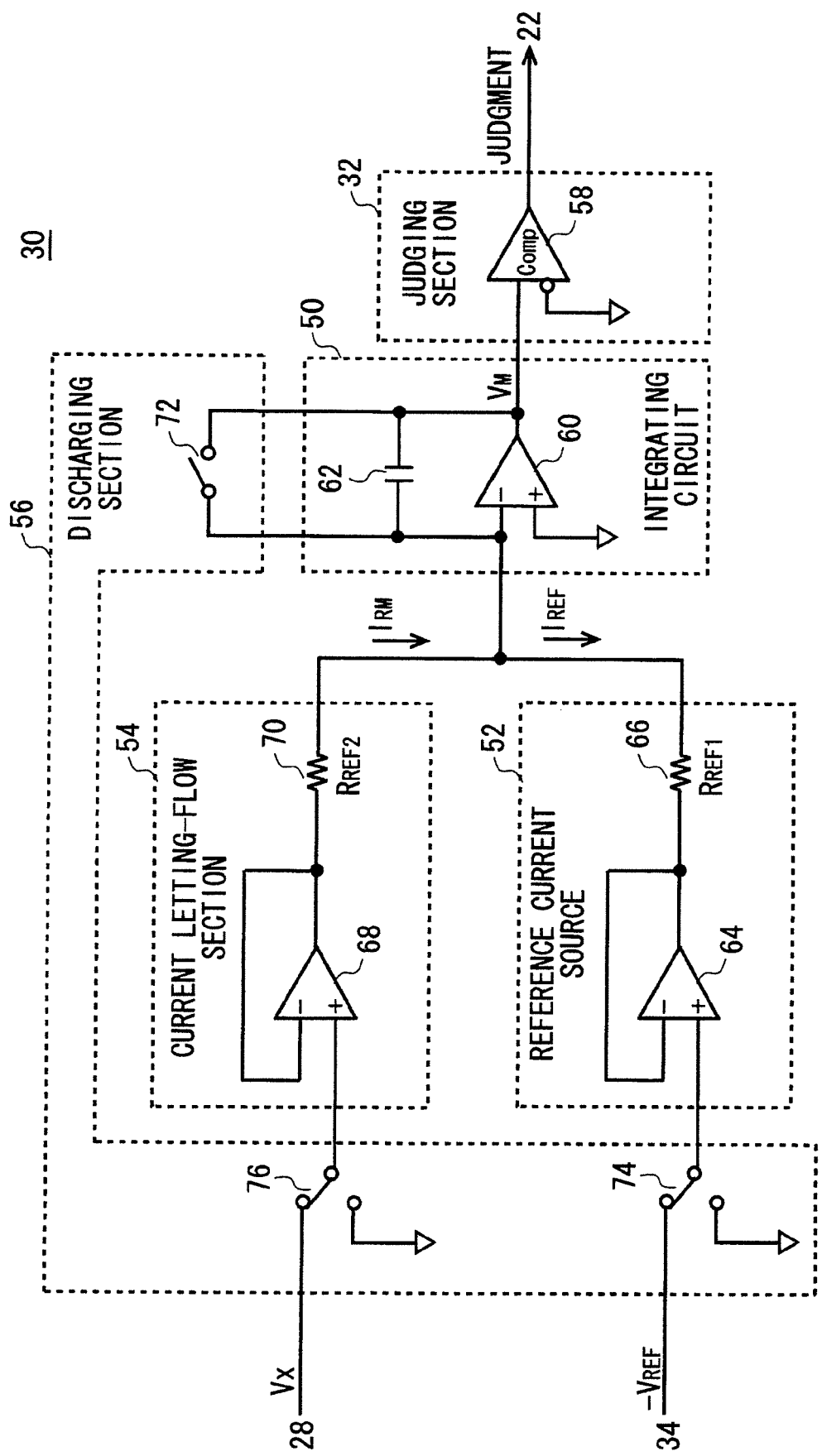
FIG. 3 shows one example of the configuration of an integrating section 30 and a judging section 32 according to the present embodiment.

FIG. 3 shows one example of the configuration of the integrating section 30 and the judging section 32 according to the present embodiment. For example, the integrating section 30 may include an integrating circuit 50, a reference current source 52, a current letting-flow section 54, and a discharging section 56. Further, the judging section 32 may include a comparator 58, for example.

The integrating circuit 50 stores the charges corresponding to the current indicating the difference between the current $I_{RM}$ detected by the current detecting section 28 and the reference current $I_{REF}$ in the capacity element, and outputs an integration voltage $V_M$ that occurs across both the ends of the capacity element as an integration value. For example, the integrating circuit 50 may include an operating amplifier 60 and an integrating capacitor 62. The operating amplifier 60 has its non-inverting input terminal connected to the common potential. The integrating capacitor 62 is connected between the output terminal and inverting input terminal of the operating amplifier 60.

The integrating circuit 50 having this configuration stores charges corresponding to an input current input to the inverting input terminal of the operating amplifier 60 in the integrating capacitor 62. Then, the integrating circuit 50 can output the integration voltage $V_M$ that occurs across both the ends of the integrating capacitor 62 in which the charges are stored. Note that the integrating circuit 50 outputs the integration voltage $V_M$, which has been inverted in positive/negative characteristic from the result of integrating the input current.

The reference current source 52 gets the reference current $I_{REF}$ to flow out from the inverting input terminal of the operating amplifier 60. The current letting-flow section 54 makes the current $I_{RM}$ detected by the current detecting section 28 flow into the inverting input terminal of the operating amplifier 60. Accordingly, the reference current source 52 and the current letting-flow section 54 can supply the current indicating the difference obtained by subtracting the reference current $I_{REF}$ from the current $I_{RM}$ detected by the current detecting section 28 to the inverting input terminal of the operating amplifier 60 as an input current thereto.

The reference current source 52 may, for example, include a first voltage follower circuit 64 and a first reference resistor 66. The first voltage follower circuit 64 has its input terminal supplied with a reference voltage $-V_{REF}$ from the setting section 34 and outputs a voltage equal to the reference voltage $-V_{REF}$ from its output terminal. The first reference resistor 66 is connected between the output terminal of the first voltage follower circuit 64 and the inverting input terminal of the operating amplifier 60, and has a predetermined resistance value $R_{REF1}$. The reference current source 52 having this configuration can make the reference current $I_{REF}$ ($=V_{REF}/R_{REF1}$), which is obtained by dividing the reference voltage $V_{REF}$ by the resistance value $R_{REF1}$, flow out from the inverting input terminal of the operating amplifier 60.

The current letting-flow section 54 may, for example, include a second voltage follower circuit 68 and a second reference resistor 70. The second voltage follower circuit 68 has its input terminal supplied with the detection voltage $V_X$ from the current detecting section 28 and outputs a voltage equal to the detection voltage $V_X$ from its output terminal. The second reference resistor 70 is connected between the output terminal of the second voltage follower circuit 68 and the inverting input terminal of the operating amplifier 60, and has a predetermined resistance value $R_{REF2}$. The current letting-flow section 54 having this configuration can make the current $I_{RM}$ ($=V_X/R_{REF2}$), which is obtained by dividing the detection voltage $V_X$ by the resistance value $R_{REF2}$, flow into the inverting input terminal of the operating amplifier 60. The resistance value $R_{REF2}$ may, for example, be determined beforehand based on the relationship between the detection voltage $V_X$ from the current detecting section 28 and the current $I_{RM}$ flowing through the wire 12.

The discharging section 56 discharges the charges stored in the integrating capacitor 62 of the integrating circuit 50 prior to a test. For example, the discharging section 56 may include a discharging switch 72, a first switch 74, and a second switch 76. The discharging switch 72 causes a short circuit across both the ends of the integrating capacitor 62 in discharging the integrating capacitor 62. Further, the discharging switch 72 opens both the ends of the integrating capacitor 62 during a test.

The first switch 74 connects the input terminal of the first voltage follower circuit 64 to the common potential in the discharging operation. The first switch 74 connects the input terminal of the first voltage follower circuit 64 to the reference voltage $-V_{REF}$ during a test. The second switch 76 connects the input terminal of the second voltage follower circuit 68 to the common potential in the discharging operation. The second switch 76 connects the input terminal of the second voltage follower circuit 68 to the detection voltage $V_X$ during a test.

The discharging section 56 having this configuration can discharge the charges stored in the integrating circuit 50 in the discharging operation. Also, the discharging section 56 can store the charges corresponding to the current indicating the difference between the current $I_{RM}$ detected by the current detecting section 28 and the reference current $I_{REF}$ in the integrating circuit 50 during a test.

The comparator 58 compares the integration voltage $V_M$ output from the integrating circuit 50 with the common potential (for example, the ground potential), and outputs a judgment corresponding to the result of comparison. That is, the comparator 58 can detect whether the integration voltage $V_M$ output from the integrating circuit 50 is positive or negative, and output a judgment corresponding to whether it is positive or negative.

For example, in a case where the integration voltage $V_M$ is positive (for example, equal to or larger than 0), the comparator 58 may judge that the average consumption current of the DUT 200 is equal to or smaller than the predetermined reference current $I_{REF}$ and hence output a pass judgment. Further, for example, in a case where the integration voltage $V_M$ is negative (for example, smaller than 0), the comparator 58 may judge that the average consumption current of the DUT 200 is larger than the predetermined reference current $I_{REF}$ and output a failure judgment. As such, since the comparator 58 needs only to detect the positive or negative characteristic of the integration voltage $V_M$ output from the integrating circuit 50, judging whether a pass or a failure is available with a simple configuration.

Figure 4:
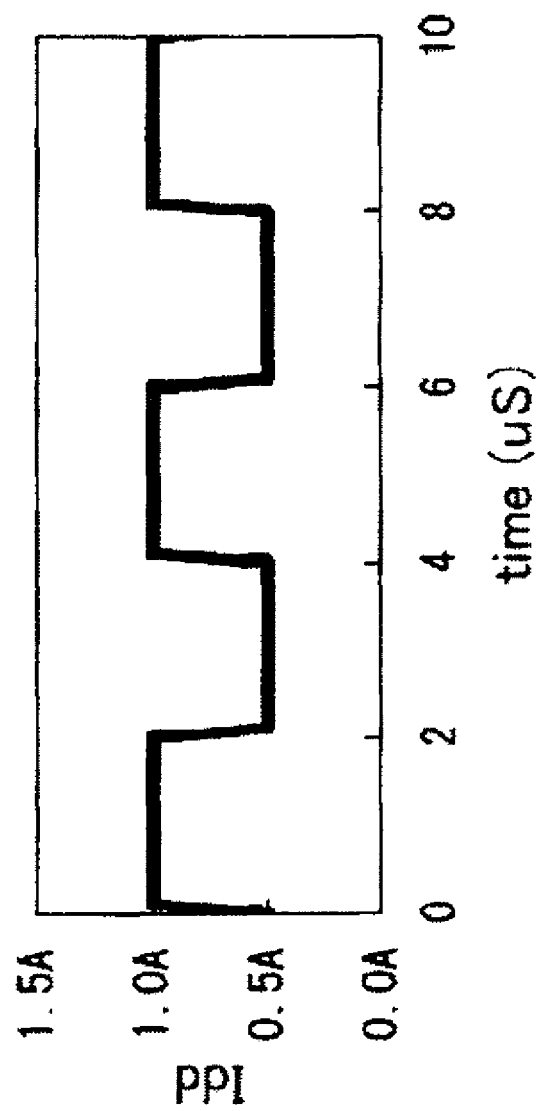
FIG. 4 shows one example of a drive current Idd (=a current to be consumed by the DUT 200) to be supplied to the DUT 200 during a test.

FIG. 4 shows one example of the drive current Idd to be supplied to the DUT 200 during a test (which is equal to the current to be consumed by the DUT 200). For example, the test apparatus 10 may control the DUT 200 to operate during a test such that a drive current Idd as shown in FIG. 4 flows through the DUT 200.

That is, the test apparatus 10 may control the DUT 200 to operate during a test such that the drive current Idd switches between 0.50 A and 1.00 A within a 4 μs period (with a duty ratio of 50%) as shown in FIG. 4. As a result, the average consumption current of the DUT 200 after the time (0 μs) is 0.75 A. In the example of FIG. 4, prior to the time (0 μs), the test apparatus 10 controls the DUT 200 to operate such that the average consumption current is 0.50 A.

Figure 5:
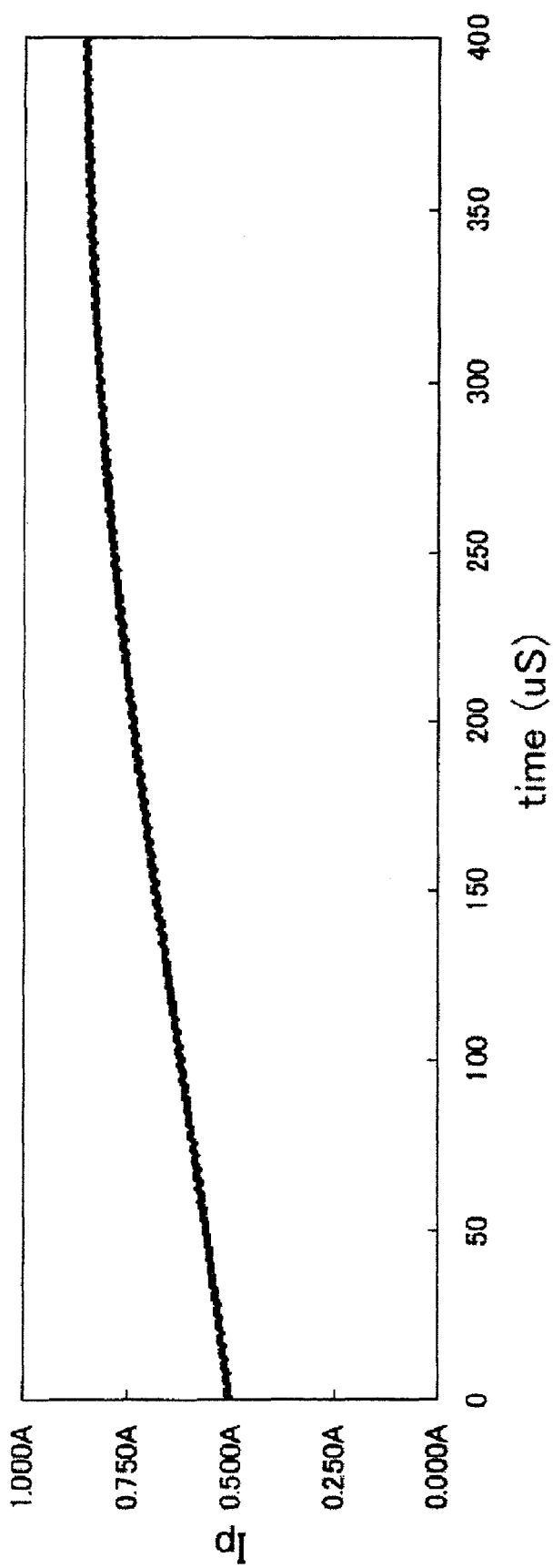
FIG. 5 shows a result of simulating an output current $I_P$ output from the voltage supplying section 18, in a case where the DUT 200 is controlled to operate as shown in FIG. 4.

FIG. 5 shows a result of simulating the output current $I_P$ output from the voltage supplying section 18 in a case where the DUT 200 is controlled to operate as shown in FIG. 4. FIG. 5 shows a simulation result under a regulated condition that the first capacitor 24 is 330 μF, the second capacitor 26 is 1 μF, a wire resistance from the voltage supplying section 18 to the detection end 14 is 5 mΩ, a wire resistance from the detection end 14 to the DUT 200 is 5 mΩ, and the voltage value of the detection end 14 is 1.20V. FIG. 6 to FIG. 9 show simulation results obtained under the same condition.

As shown in FIG. 5, the voltage supplying section 18 outputs an output current $I_P$ which does not timely respond to the average consumption current of the DUT 200. Specifically, the voltage supplying section 18 outputs an output current $I_P$ which will reach the average consumption current (0.75 A) of the DUT 200 at a time 200 μs.

Figure 6:
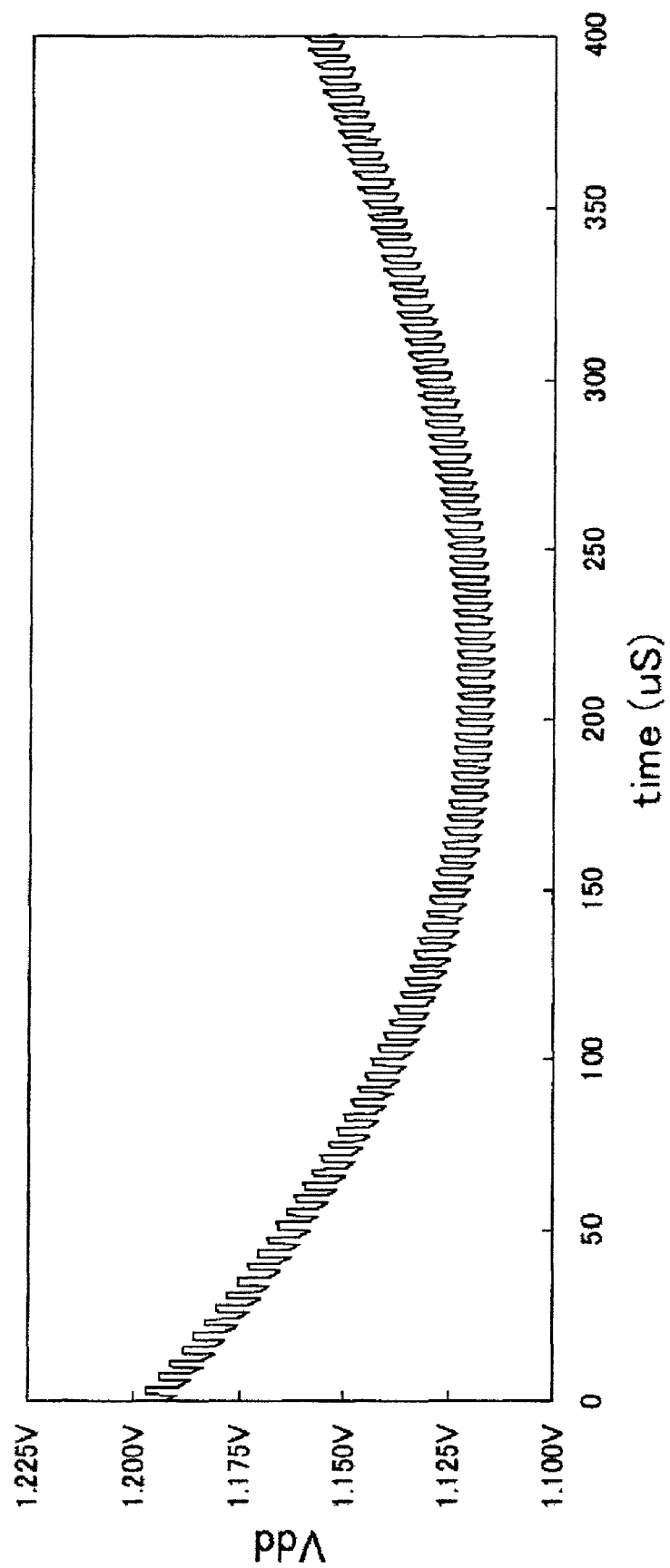
FIG. 6 shows a result of simulating a drive voltage Vdd in a case where the DUT 200 is controlled to operate as shown in FIG. 4.

FIG. 6 shows a result of simulating the drive voltage Vdd in a case where the DUT 200 is controlled to operate as shown in FIG. 4. The voltage supplying section 18 reduces its output voltage during a period in which it increases its output current $I_P$. Then, the voltage supplying section 18 returns the output voltage to its original after the output voltage $I_P$ gets stabilized. Accordingly, the drive voltage Vdd gradually decreases until before the output current $I_P$ becomes stabilized (time 0 μs to time 200 μs) and gradually increases after the output current $I_P$ becomes stabilized (after time 200 μs), as shown in FIG. 6.

Figure 7:
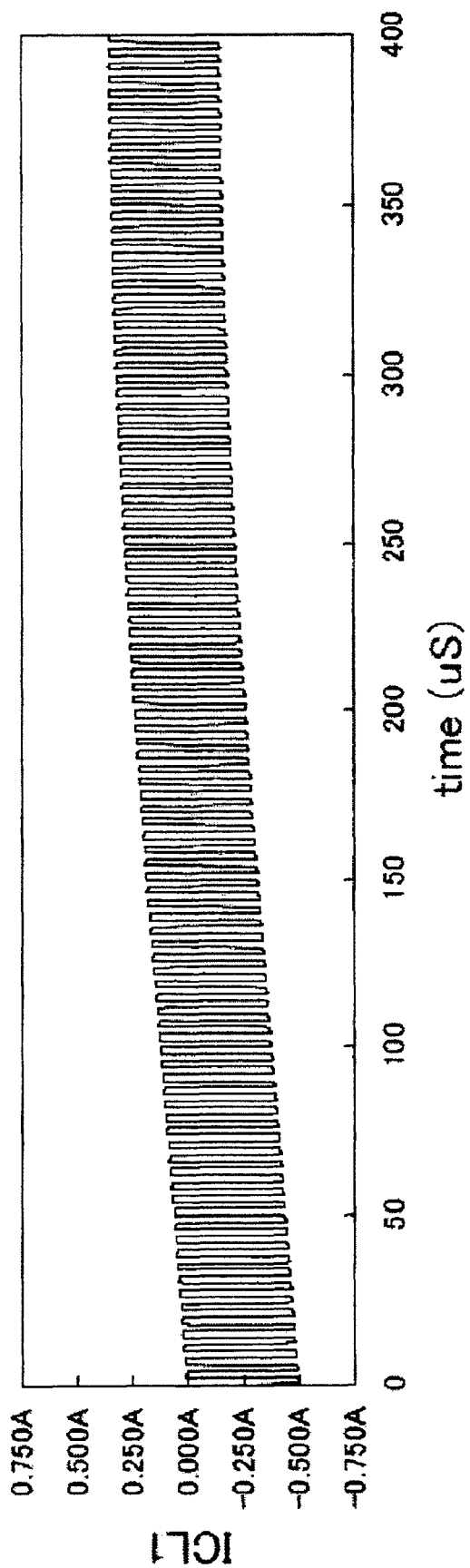
FIG. 7 shows a result of simulating a current $I_{CL1}$ flowing through a first capacitor 24 in a case where the DUT 200 is controlled to operate as shown in FIG. 4.

FIG. 7 shows a result of simulating a current $I_{CL1}$ which flows through the first capacitor 24 in a case where the DUT 200 is controlled to operate as shown in FIG. 4. The current $I_{CL1}$ which flows through the first capacitor 24 changes its amplitude in synchronization with the fluctuations of the drive current Idd.

In a case where the output current $I_P$ lags behind in responding to a change in the average consumption current of the DUT 200, the first capacitor 24 supplies a current to fill the shortage, which is the difference obtained by subtracting the output current $I_P$ from the average consumption current, to the DUT 200. Accordingly, during the period in which the voltage supplying section 18 increases the output current $I_P$ (before time 200 μs), the average value of the current $I_{CL1}$ takes a negative value. After the time at which the output current $I_P$ becomes stabilized (after time 200 μs), the average value of the current $I_{CL1}$ increases from a negative value toward 0.

Figure 8:
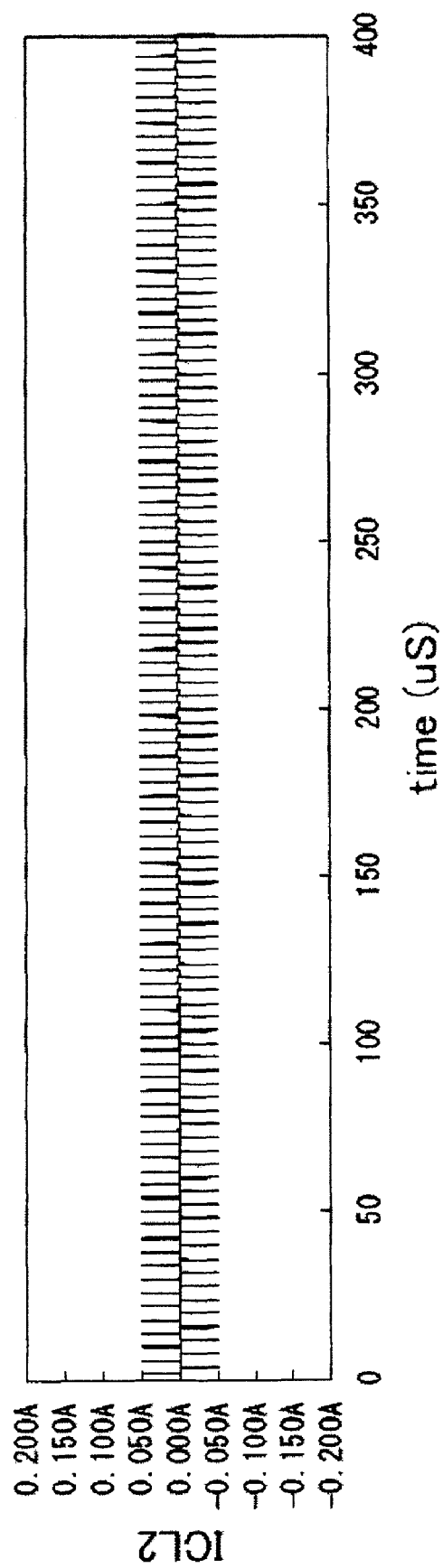
FIG. 8 shows a result of simulating a current $I_{CL2}$ flowing through a second capacitor 26 in a case where the DUT 200 is controlled to operate as shown in FIG. 4.

FIG. 8 shows a result of simulating a current $I_{CL2}$ which flows through the second capacitor 26 in a case where the DUT 200 is controlled to operate as shown in FIG. 4. The current $I_{CL2}$ which flows through the first capacitor 24 changes its amplitude in synchronization with the fluctuations of the drive current Idd. However, since the second capacitor 26 has much smaller capacitance than that of the first capacitor 24, it cannot supply a current enough to fill the shortage, which is the difference obtained by subtracting the output current $I_P$ from the average consumption current, to the DUT 200. Hence, the average value of the current $I_{CL2}$ takes 0 even when any change occurs in the average consumption current of the DUT 200.

Figure 9:
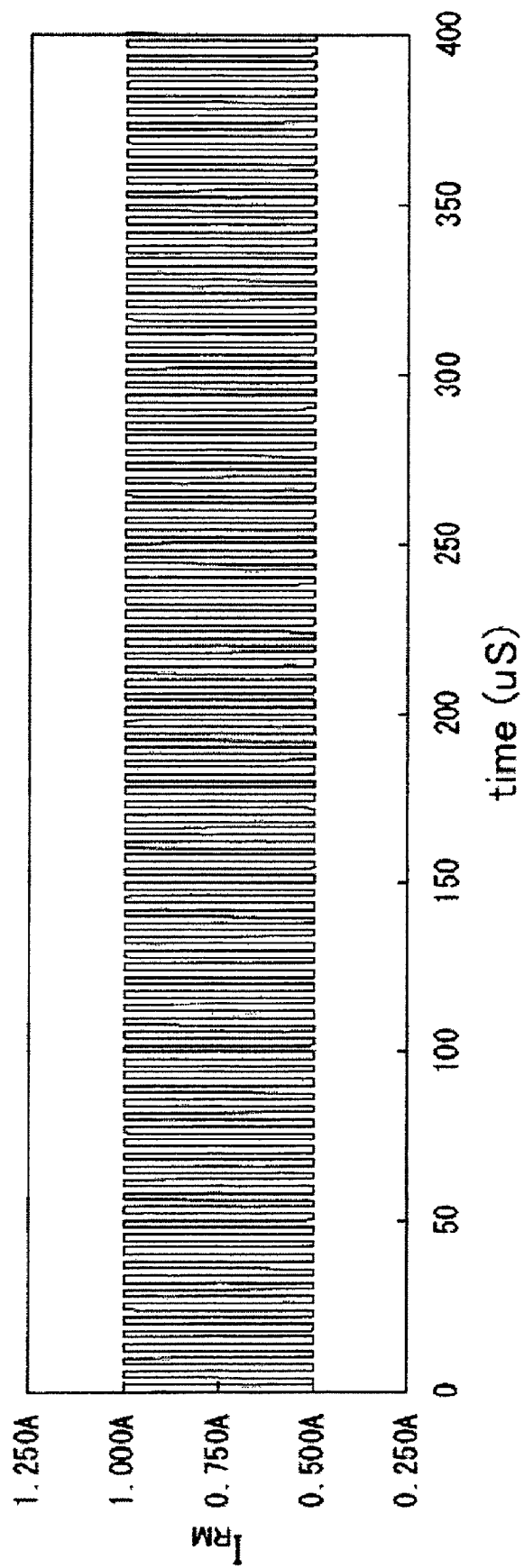
FIG. 9 shows a result of simulating a current $I_{RM}$ flowing through a wire 12 between the first capacitor 24 and the second capacitor 26 in a case where the DUT 200 is controlled to operate as shown in FIG. 4.

FIG. 9 shows a result of simulating the current $I_{RM}$ which flows through the wire 12 between the first capacitor 24 and the second capacitor 26 in a case where the DUT 200 is controlled to operate as shown in FIG. 4. As shown in FIG. 9, the average value of the current $I_{RM}$ is 0.75 A all the time. That is, even during the period in which the voltage supplying section 18 increases the output current $I_P$ (before time 200 μs), the average value of the current $I_{RM}$ coincides with the average consumption current of the DUT 200.

The test apparatus 10 judges whether the average consumption current of the DUT 200 is larger than the predetermined reference current $I_{REF}$ or not, based on the integration value obtained by integrating the difference between the current $I_{RM}$ flowing through the wire 12 between the first capacitor 24 and the second capacitor 26 and the reference current $I_{REF}$. Accordingly, the test apparatus 10 can accurately judge whether the average consumption current of the DUT 200 is larger than the reference current $I_{REF}$ or not at all the times.

Figure 10:
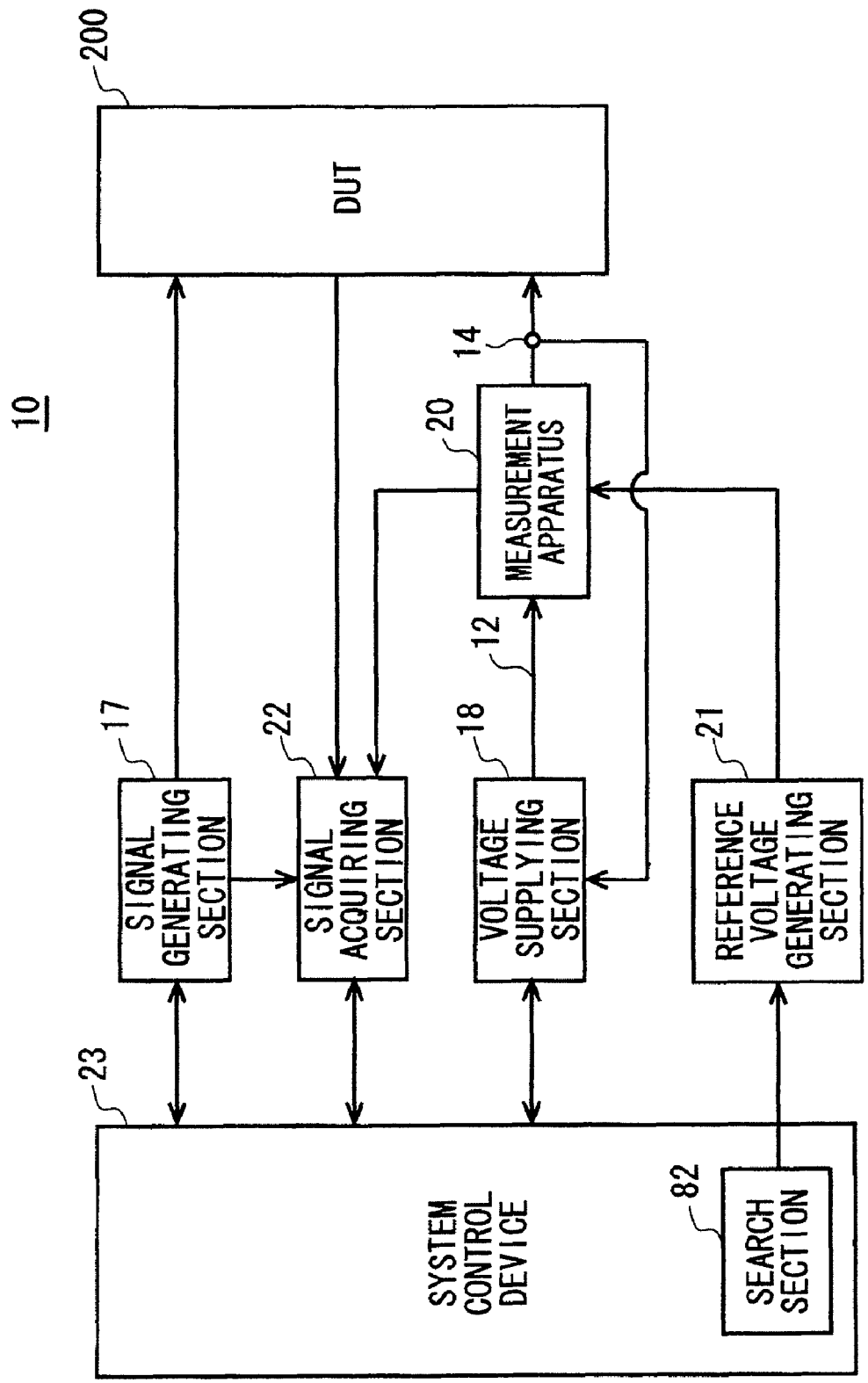
FIG. 10 shows the configuration of the test apparatus 10 according to a first modification of the present embodiment, together with the DUT 200.
Figure 11:
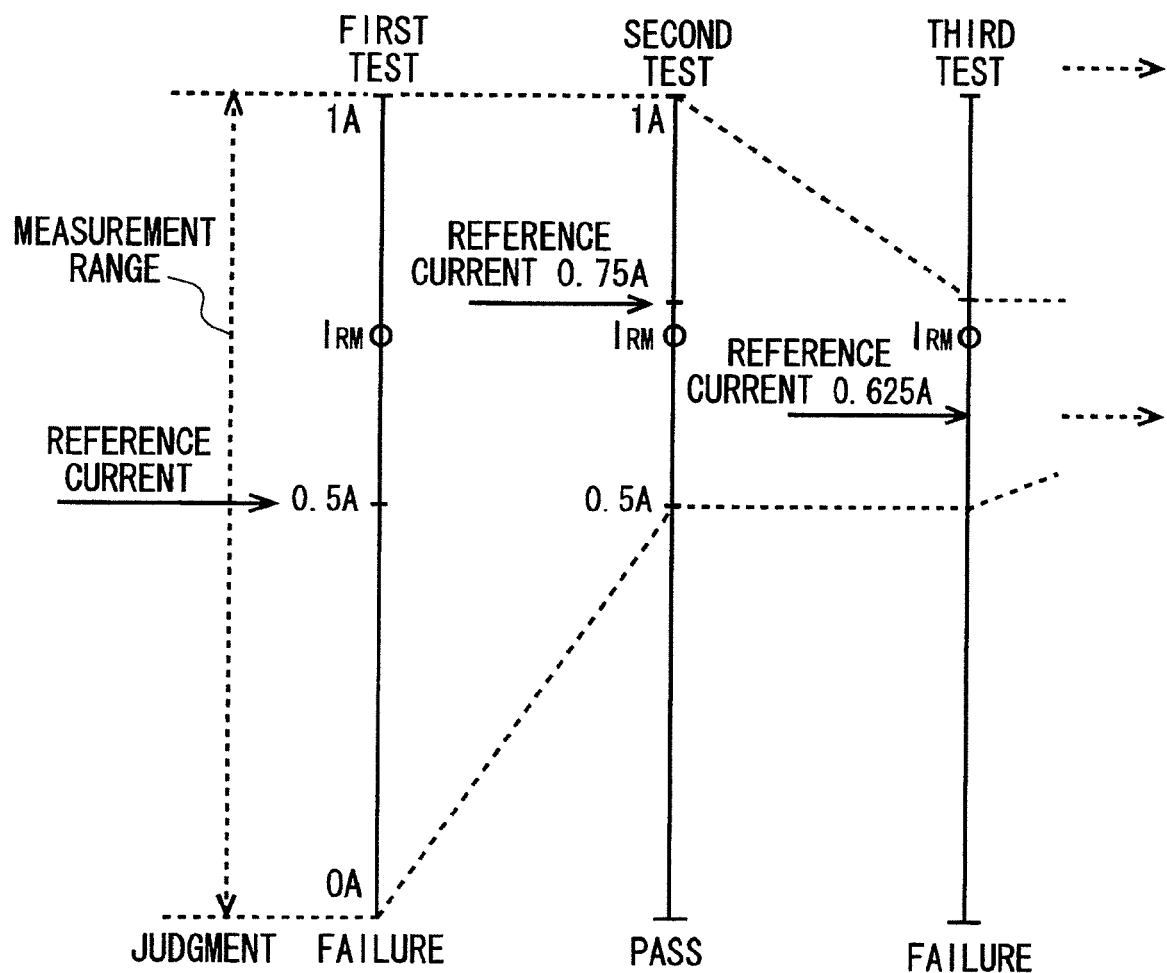
FIG. 11 shows one example of the reference current $I_{REF}$ set by a search section 82 of the test apparatus 10 according to the first modification.

FIG. 10 shows the configuration of the test apparatus 10 according to a first modification of the present embodiment, together with the DUT 200. FIG. 11 shows one example of a reference current $I_{REF}$ which is set by a search section 82 of the test apparatus 10 according to the first modification. The test apparatus 10 according to the present modification has generally the same functions and configuration as those of the test apparatus 10 shown in FIG. 1, so those members that have generally the same configuration and function as those of the members shown in FIG. 1 will be denoted by the same reference numerals in the drawing and explanation for such members will be omitted but for any differences.

The test apparatus 10 according to the present modification may further comprise a search section 82. In the present modification, the CPU in the system control device 23 executes a measuring program for measuring the current value of a current flowing through a wire, and hence makes the system control device 23 function as the search section 82. The search section 82 varies the reference current $I_{REF}$ from test to test based on the judgment produced in the previous test by using a binary search method, and determines the current value (absolute value) of the current $I_{RM}$ flowing through the wire 12.

To be more specific, the search section 82 first sets the reference current $I_{REF}$, which takes the center value of a measurement range, which is a range of current values to be measured. Then, the search section 82 makes the test apparatus 10 perform the test. That is, the search section 82 makes the test apparatus 10 judge whether the average consumption current of the DUT 200 is larger than the reference current $I_{REF}$ or not.

Subsequently, the search section 82 determines to which of the upper and lower ranges within the measurement range that are divided at the level of the reference current $I_{REF}$ the current $I_{RM}$ flowing through the wire 12 belongs. Then, the search section 82 sets the range determined to include the current $I_{RM}$ as a new measurement range, and sets a new reference current $I_{REF}$, which takes the center value of the new measurement range. Then, the search section 82 repeats the above process plural times and narrows down the range to which the current $I_{RM}$ flowing through the wire 12 belongs to determine the current value (absolute value) of the current $I_{RM}$ flowing through the wire 12.

As shown in FIG. 11 for example, the search section 82, for example, first sets the center of a first measurement range (for example, 0 A to 1 A) to be the reference current $I_{REF}$ (for example, 0.5 A). Then, the search section 82 makes the test apparatus 10 perform a first test. The search section 82 determines to which of a lower range (0 A to 0.5 A) and an upper range (0.5 A to 1 A), which are obtained by dividing the measurement range to upper and lower parts at the reference current $I_{REF}$, the current $I_{RM}$ flowing through the wire 12 belongs, based on the judgment (a pass or a failure) obtained from the first test. In the present example, the first test turns out a failure judgment and hence the search section 82 determines that the current $I_{RM}$ belongs to the upper range (0.5 A to 1 A).

Then, the search section 82 sets the determined range (0.5 A to 1 A) as a new measurement range, and sets a new reference current $I_{REF}$ (for example, 0.75 A), which takes the center value of the new measurement range. Then, the search section 82 makes the test apparatus 10 perform a second test and repeats the same process as that in the first test.

The search section 82 do the same things for the third test and thereafter. Then, the search section 82 narrows down the range to which the current $I_{RM}$ belongs, and ultimately determines the current value of the current $I_{RM}$. As obvious from the above, the test apparatus 10 according to the present modification can measure the absolute value of the average consumption current of the DUT 200.

Figure 12:
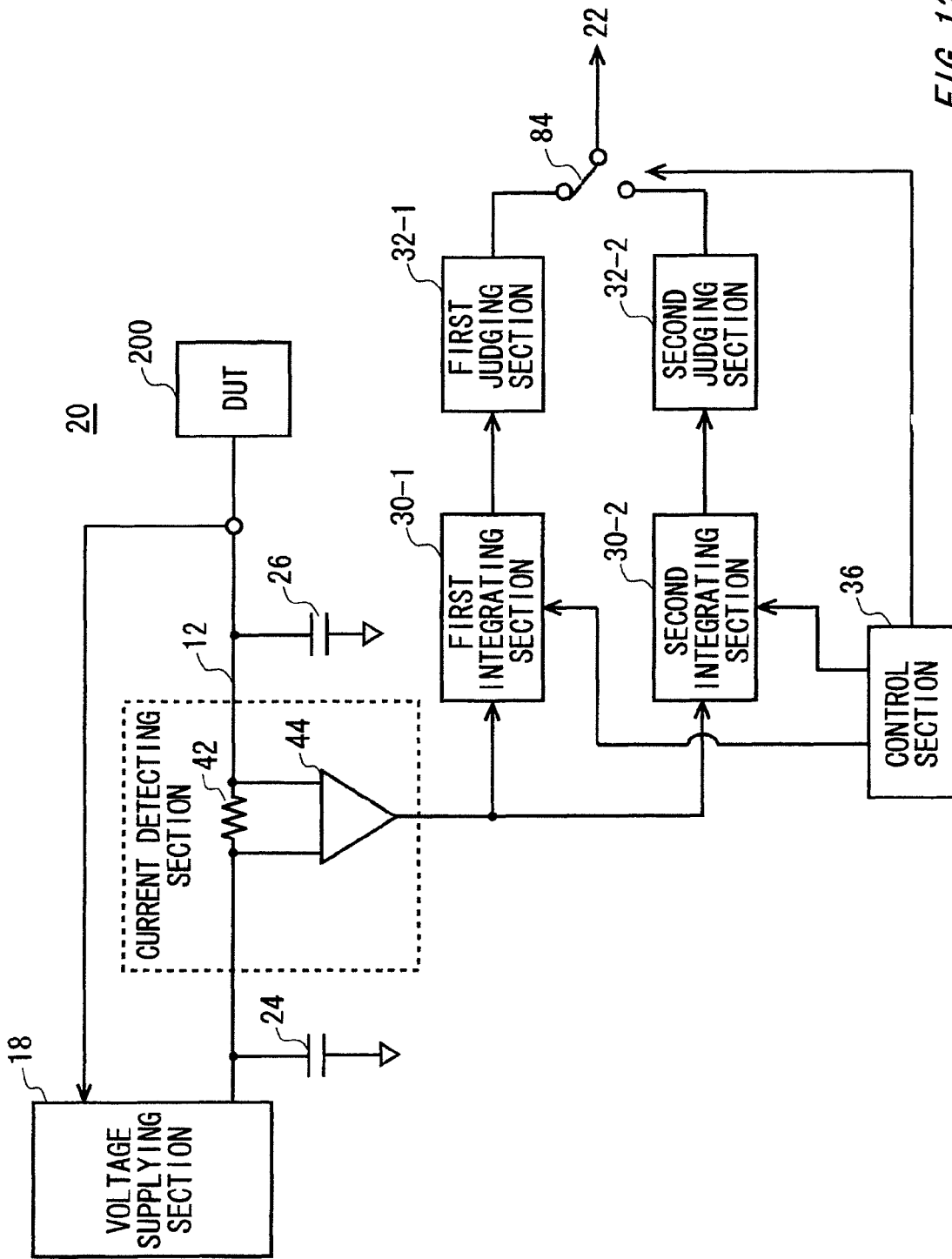
FIG. 12 shows the configuration of the test apparatus 10 according to a second modification of the present embodiment, together with the DUT 200.

FIG. 12 shows the configuration of the measurement apparatus 20 according to a second modification of the present embodiment, together with the DUT 200. The measurement apparatus 20 according to the present modification has generally the same functions and configuration as those of the measurement apparatus 20 shown in FIG. 2, and thus those members that have generally the same configuration and function as those of the members shown in FIG. 2 will be denoted by the same reference numerals in the drawing and explanation for such members will be omitted but for any differences.

The measurement apparatus 20 according to the present modification comprises a first integrating section 30-1, a second integrating section integrating section, a first judging section 32-1, a second judging section 32-2, and a selecting outputter 84 instead of the integrating section 30 and the judging section 32. Each of the first integrating section 30-1 and the second integrating section integrating section stores charges corresponding to a current indicating the difference between the current $I_{RM}$ detected by the current detecting section 28 and the predetermined reference current $I_{REF}$ in a capacity element, and outputs the integration voltage that occurs across both the ends of the capacity element. Each of the first integrating section 30-1 and the second integrating section integrating section may, for example, have the configuration shown in FIG. 3.

The first judging section 32-1 judges whether the DUT 200 is a pass or a failure based on the integration voltage output from the first integrating section 30. The second judging section 32-2 judges whether the DUT 200 is a pass or a failure based on the integration voltage output from the second integrating section 30. Each of the first judging section 32-1 and the second judging section 32-2 may, for example, have the same configuration and function as those of the judging section 32. The selecting outputter 84 selects and outputs the judgment output from a designated one of the first judging section 32-1 and the second judging section 32-2.

The control section 36 controls the integration period and discharge period of the first integrating section 30-1 and second integrating section integrating section. Further, the control section 36 notifies the selecting outputter 84 of a designated one of the first judging section 32-1 and the second judging section 32-2 from which the judgment should be output.

Here, the control section 36 selects the first integrating section 30-1 and the second integrating section integrating section alternately from test to test, such that the selected one stores charges and outputs an integration value. Then, the control section 36 controls the second integrating section integrating section to discharge the stored charges while the first integrating section 30-1 is storing charges. Further, the control section 36 controls the first integrating section 30-1 to discharge the stored charges while the second integrating section integrating section is storing charges.

The measurement apparatus 20 according to this modification can eliminate time in which no test can be performed for the purposes of discharging. Hence, the test apparatus 10 having this measurement apparatus 20 can shorten the time taken for tests.

Figure 13:
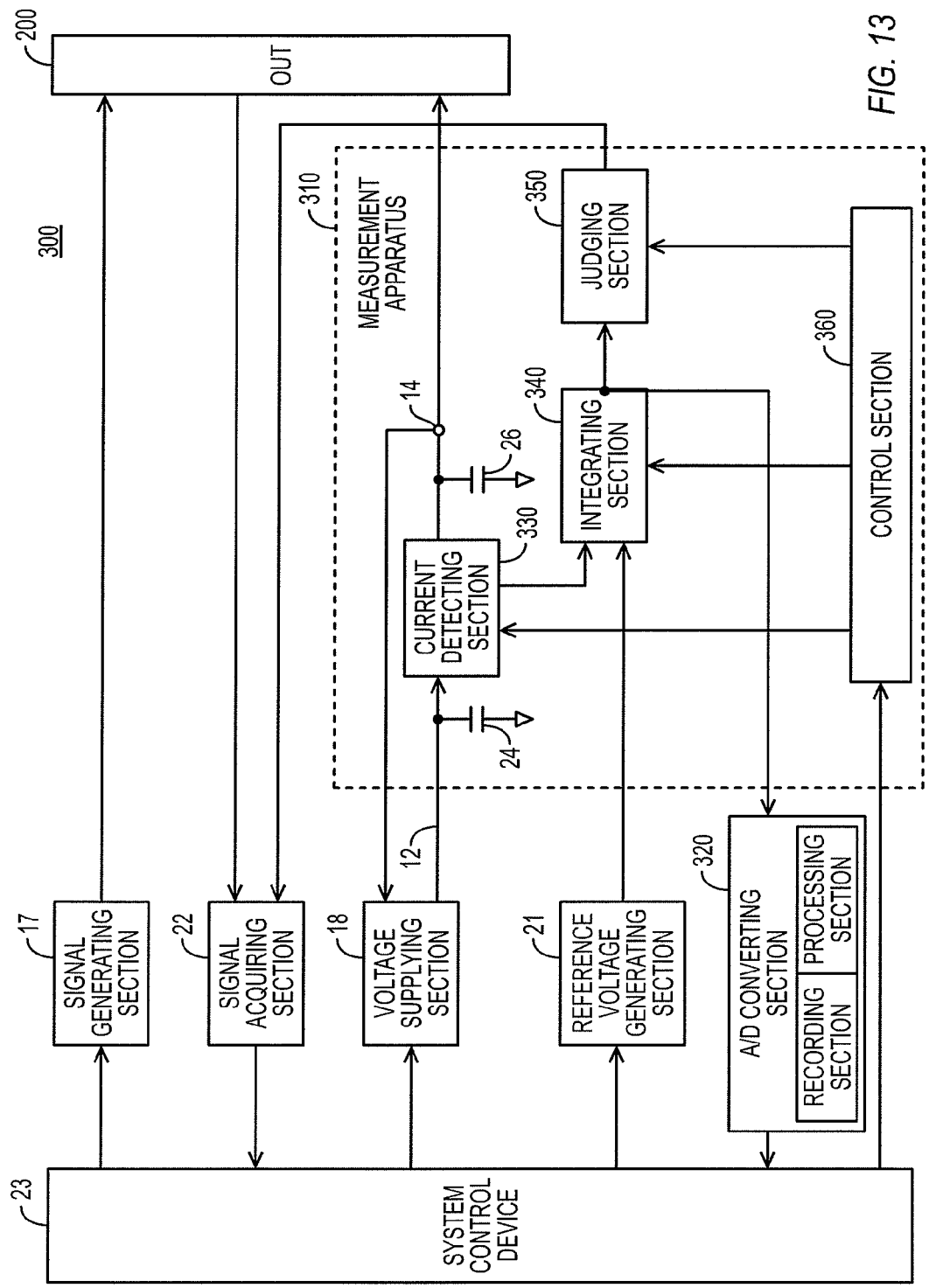
FIG. 13 shows a configuration of a test apparatus 300 according to a third embodiment of the present invention, along with the DUT 200.

FIG. 13 shows a configuration of a test apparatus 300 according to a third modification of the present invention, along with the DUT 200. The test apparatus 300 according to the present modification has generally the same functions and configuration as those of the test apparatus 10 shown in FIGS. 1 to 3, so those members that have generally the same configuration and function as those of the members shown in FIGS. 1 to 3 will be denoted by the same reference numerals in the drawing and explanation for such members will be omitted but for any differences.

The test apparatus 300 tests the DUT 200 and is provided with the signal generating section 17, the voltage supplying section 18, a measurement apparatus 310, the reference voltage generating section 21, the signal acquiring section 22, the system control device 23, and an AD converting section 320. The measurement apparatus 310 has the same function and configuration as the measurement apparatus 20. The measurement apparatus 310 is provided with the first capacitor 24, the second capacitor 26, a current detecting section 330, an integrating section 340, a judging section 350, and a control section 360. The control section 360 may have the same function as the setting section 34 and the control section 36.

Figure 14:
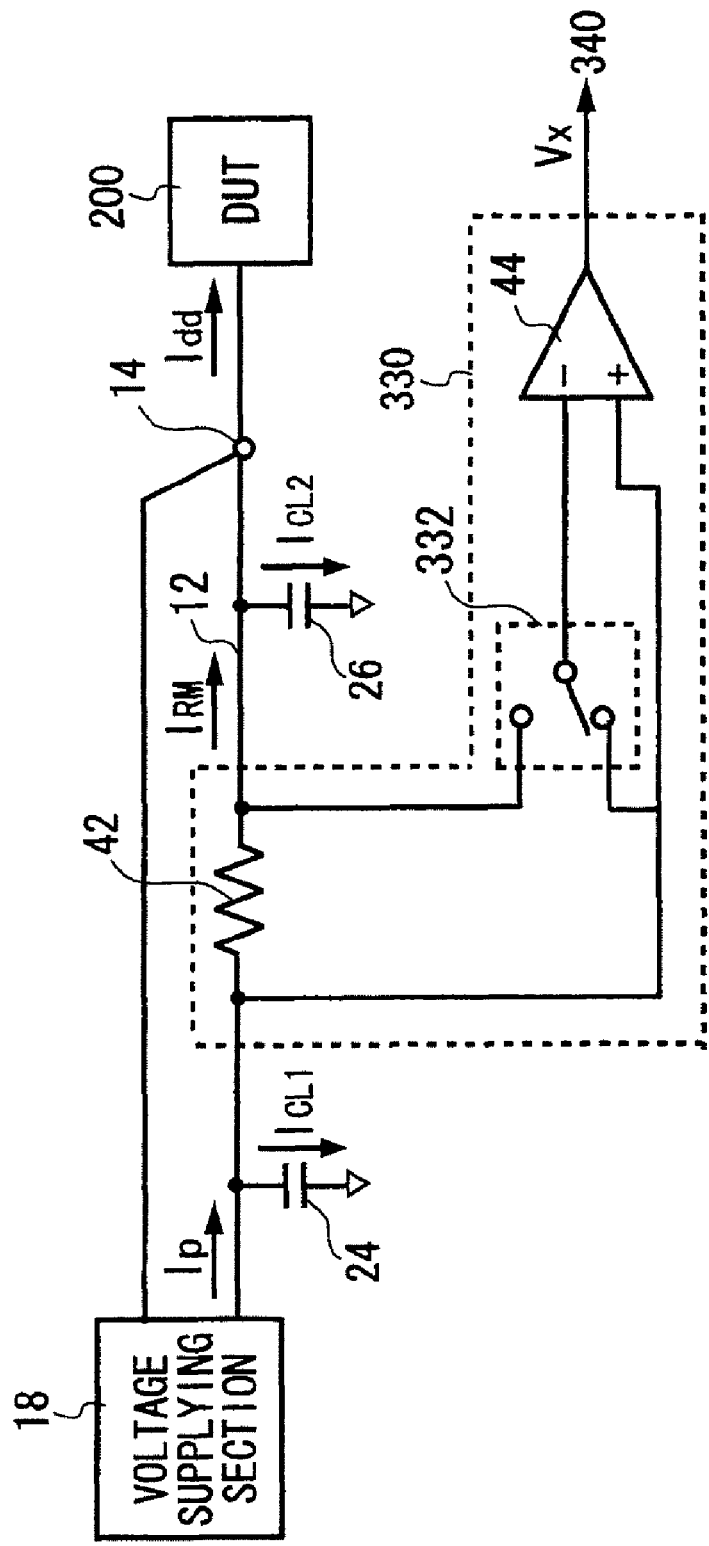
FIG. 14 shows a configuration of the current detecting section 330 according to the present embodiment, along with the voltage supplying section 18 and the DUT 200.

FIG. 14 shows a configuration of the current detecting section 330 according to the present modification, along with the voltage supplying section 18 and the DUT 200. The current detecting section 330 may include the detection resistor 42, the potential difference detecting section 44, and an input switching section 332. The detection resistor 42 can be used in place of the coil. The input switching section 332 selects one of (i) a detection input for detecting the current $I_{RM}$ flowing through the wire 12 and (ii) a correction input that is equivalent to an input causing the current flowing through the wire 12 to be zero. The input causing the current flowing through the wire 12 to be zero may be exemplified by an input causing a short between the inputs of the potential difference detecting section 44.

When the input switching section 332 selects the correction input, the output Vx of the potential difference detecting section 44 outputs the offset error. For example, when the offset of the potential difference detecting section 44 is 100 μV and the gain is 100, the offset error voltage is (offset)×(gain+1)=10.1 mV. If Idd is 2 A and the detection resistor 42 is 5 mΩ, the gain is 100, and therefore the signal output voltage is 1V. In this case, the measurement of 2 A includes an offset error voltage of approximately 1%, which is not a small error.

Figure 15:
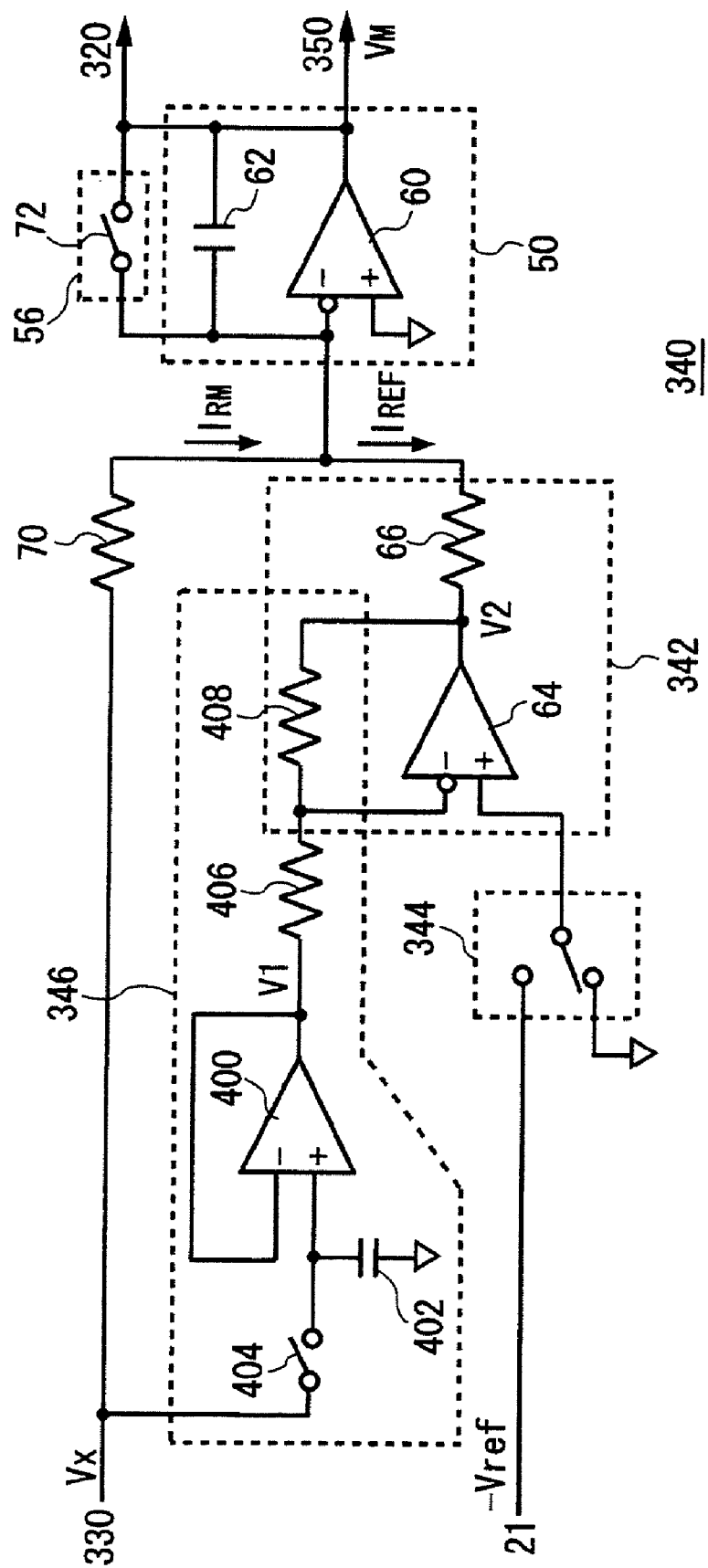
FIG. 15 shows an exemplary configuration of the integrating section 340 according to the present embodiment.

FIG. 15 shows an exemplary configuration of the integrating section 340 according to the present modification. The integrating section 340 includes the integrating circuit 50, the discharging section 56, a reference current source 342, a reference switching section 344, and an offset correcting section 346. The integrating circuit 50 includes the operating amplifier 60 and the integrating capacitor 62. The integrating circuit 50 stores, in the integrating capacitor 62, a charge corresponding to the difference in current between the reference current $I_{REF}$ and the current $I_{RM}$ detected by the current detecting section 330. This integrating capacitor 62 is an example of a capacity element. The integrating circuit 50 outputs the integration voltage $V_M$ generated at both ends of the capacity element as the integration value. The discharging section 56 includes the discharging switch 72. Before beginning the test, the discharging section 56 discharges the charge stored in the integrating circuit 50.

The reference current source 342 outputs the reference current $I_{REF}$ from the input of the integrating circuit 50. The reference current source 342 includes the first voltage follower circuit 64 and the first reference resistor 66. The second reference resistor 70 has the same function as the first current letting-flow section 54. The reference switching section 344 selects whether the reference input of the reference current source 342 connects to the reference voltage $V_{REF}$ or to the ground voltage.

The offset correcting section 346 corrects the offset occurring at the input of the integrating circuit 50. The offset correcting section 346 includes the correction capacitor 402 that stores the offset error voltage output by the current detecting section 330, when the input switching section 332 selects the correction input and the reference switching section 344 selects the ground voltage, i.e. during correction. When the input switching section 332 selects the detection input and the reference switching section 344 selects the reference voltage, i.e. during measurement, the offset correcting section 346 outputs a voltage equal to −1 times the offset error voltage stored in the correction capacitor 402. The switch 404 is a short during correction and is open during measurement.

As shown in FIG. 15, the offset error voltage stored in the correction capacitor 402 is input to the positive input of the operating amplifier 400 and the output is fed back to the negative input of the operating amplifier 400, so that the output V1 of the operating amplifier 400 is equal to the stored offset error voltage. On the other hand, the output V1 is connected to the feedback portion of the first voltage follower circuit 64 via the resistance 406, and therefore, if the resistance 406 and the resistance 408 have equal resistance values, the value equal to −1 times the output V1 is superimposed on the output V2 of the first voltage follower circuit 64. This generates a reference current component that cancels out the current caused by the offset error voltage, thereby decreasing the effect of the offset error voltage.

Figure 16:
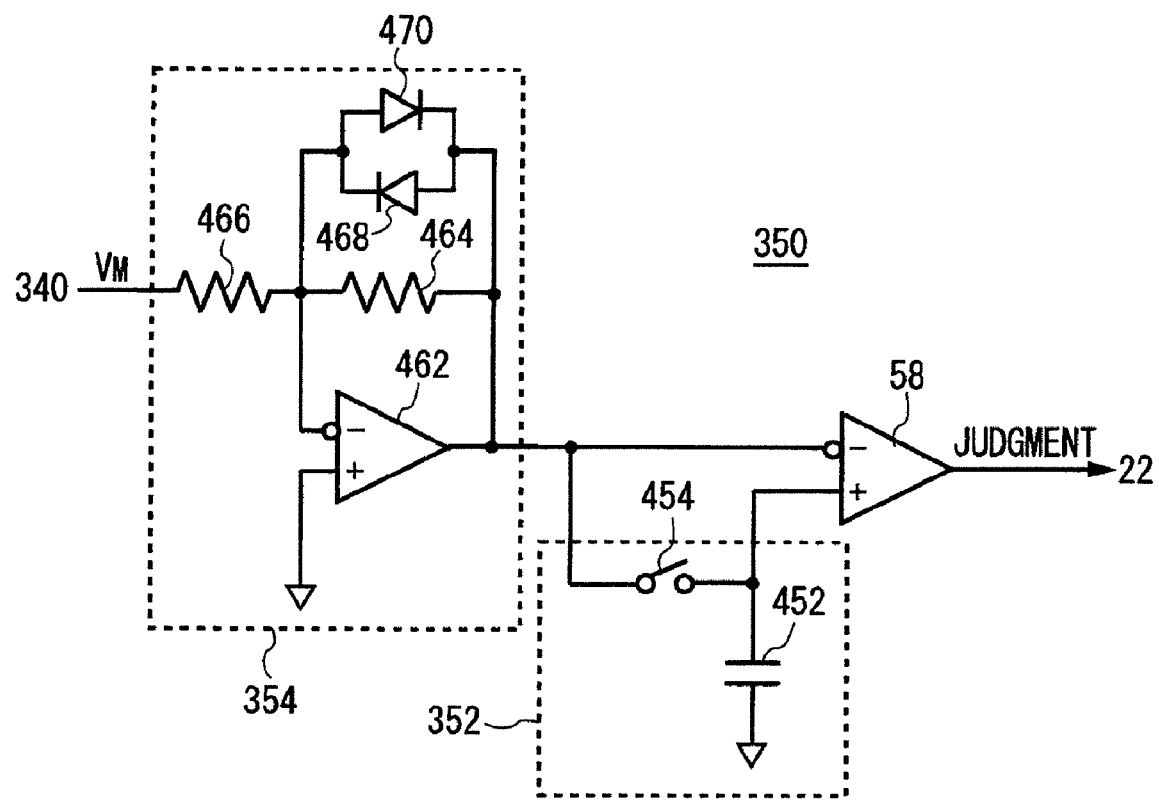
FIG. 16 shows an exemplary configuration of the judging section 350 according to the present embodiment.

FIG. 16 shows an exemplary configuration of the judging section 350 according to the present modification. The judging section 350 includes an offset holding section 352 that holds the offset occurring at the output of the integrating circuit 50, when the input switching section 332 selects the correction input and the reference switching section 344 selects the ground voltage, i.e. during correction. The offset holding section 352 includes an offset capacitor 452 and a switch 454. The offset occurring at the output of the integrating circuit 50 is stored in the offset capacitor 452. The switch 454 is a short during correction and is open during measurement.

When the input switching section 332 selects the detection input and the reference switching section 344 selects the reference voltage, i.e. during measurement, the judging section 350 judges whether the DUT 200 is defective based on the offset voltage held by the offset capacitor 452 of the offset holding section 352. This enables correcting of the offset occurring upstream from the comparator 58, so that the current can be accurately measured.

A low-voltage amplifying section 354 may be provided that amplifies the integration value and supplies the amplified integration value to the judging section 350. Since the offset correction sets the integration value to a sufficiently low level, amplifying the integration value using the low-voltage amplifying section 354 has significant meaning.

The AD converting section 320 measures the integration value. The AD converting section 320 can record the digital values obtained by measuring the integration value for each measurement cycle in a recording section, measure the values obtained when only the reference current is input before or after a series of measurements, and scale the digital values of each measurement cycle recorded on the recording medium with the measured values. The recording section and the processing section that performs the scaling process may be provided to the system control device 23. The AD converting section 320 enables the current value to be scaled by measuring the reference current only once before or after the series of measurements. This scaling is used to obtain the current value of the digital values measured in each measurement cycle.

Figure 17:
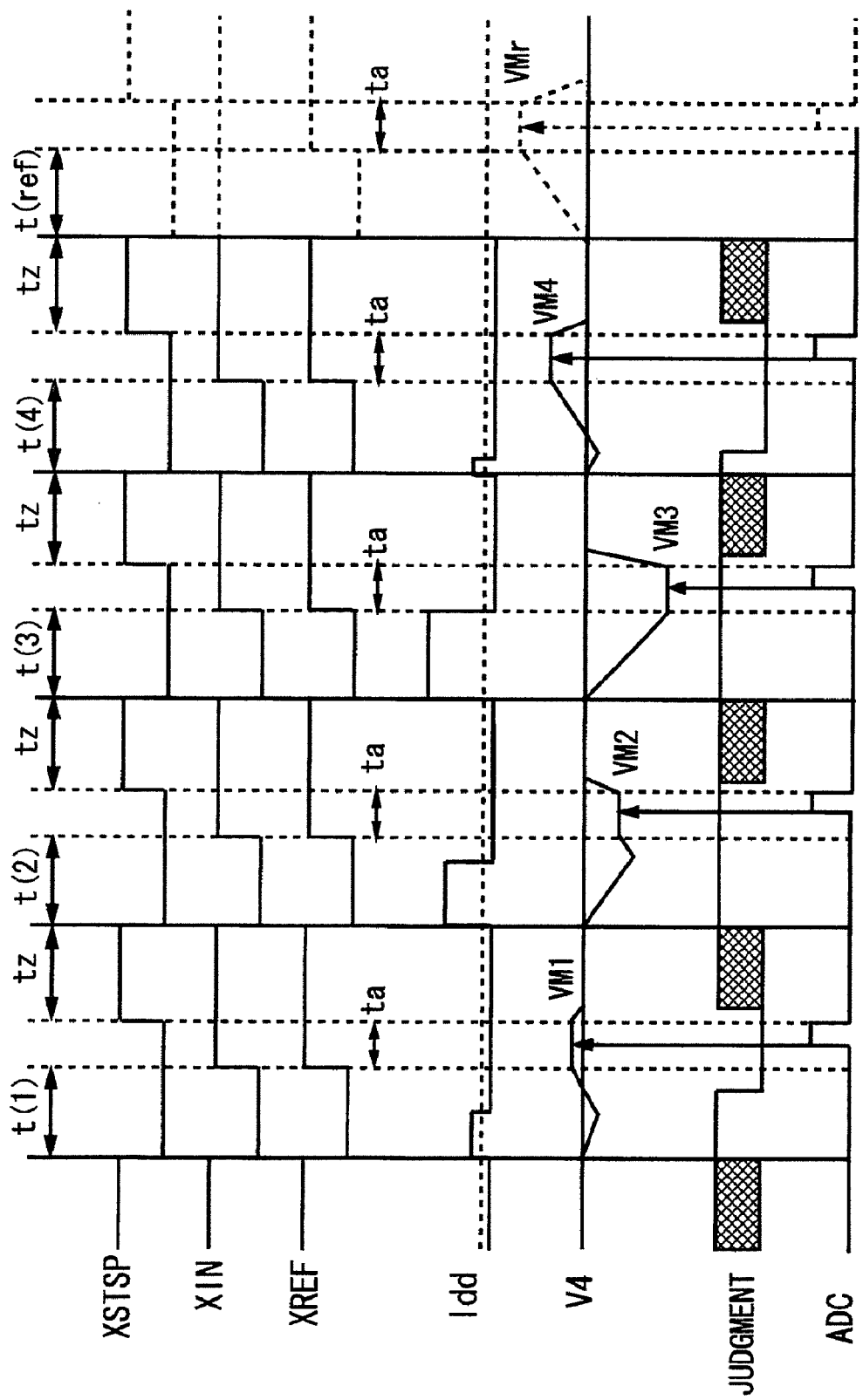
FIG. 17 shows an exemplary operation of the test apparatus 300 according to the third embodiment.

FIG. 17 shows an exemplary operation of the test apparatus 300 according to the third embodiment. Here, XSTSP represents the control signal of the switch 404, XIN represents the control signal of the input switching section 332, and XREF represents the control signal of the reference switching section 344. Current measurement is performed while all of these control signals are logic L, i.e. during the period t(n). In the current measurement, the difference between the current Idd flowing through the DUT 200 and the reference current, shown by the dotted lines in FIG. 17, is detected as the output $V_M(V4)$ of the integrating circuit 50. The defectiveness judgment is based on whether the output $V_M(V4)$ is positive or negative. Furthermore, ta represents the period over which the output $V_M(V4)$ is held, and the integration value, which is the output from the AD converting section 320, is acquired during this period. The acquired integration value is scaled with the integration value of only the reference current measured during the period t(ref).

One aspect of the present invention has been explained above using an embodiment, but the technical scope of the present invention is not limited to the scope described in the above embodiment. Various modifications or alterations can be made upon the above-described embodiment. It is obvious from the claims that any embodiment upon which such modifications or alterations are made can also be included in the technical scope of the present invention.

The operations, procedures, steps, and stages of each process performed by an apparatus, system, program, and method shown in the claims, embodiments, or diagrams can be performed in any order as long as the order is not indicated by "prior to," "before," or the like and as long as the output from a previous process is not used in a later process. Even if the process flow is described using phrases such as "first" or "next" in the claims, embodiments, or diagrams, it does not necessarily mean that the process must be performed in this order.

What is claimed is:

1. A test apparatus for testing a device under test, comprising:
   a voltage supplying section that supplies a voltage to a device under test through a wire;
   a first capacitor that is arranged between the wire and a common potential in series;
   a current detecting section that detects a current flowing through the wire at a location that is closer to the device under test than the first capacitor is;
   an integrating section that outputs an integration value obtained by integrating a difference between the current detected by the current detecting section and a predetermined reference current;
   a judging section that judges whether the device under test is a pass or a failure based on the integration value; and
   a search section that repetitively varies the predetermined reference current value from test to test to determine an absolute value of the detected current,
   wherein the search section initially sets the predetermined reference current to a center value of a measurement range of current values to be measured,
   wherein, upon each judgment of whether the detected current value exceeds the predetermined reference current, it is determined whether the detected current is in an upper range or a lower range of the measurement range, upon the determination the determined upper or lower range is set as a new measurement range, and a new predetermined reference current is set as the center value of the new measurement range,
   wherein the search section repeats the setting process a plurality of times to narrow the range and determine the absolute value of the current flowing through the wire.

2. The test apparatus according to claim 1, wherein
   the integrating circuit includes:
   an operating amplifier whose non-inverting input terminal is connected to the common potential; and
   an integrating capacitor that is connected between an output terminal and inverting input terminal of the operating amplifier, and
   the integrating section further includes:
   a reference current source that makes the reference current flow out from the inverting input terminal of the operating amplifier; and
   a current letting-flow section that makes the current detected by the current detecting section flow into the inverting input terminal of the operating amplifier.

3. The test apparatus according to claim 1, further comprising:
   the integrating section as a first integrating section, and one more of the integrating section as a second integrating section; and
   a control section that controls the second integrating section to discharge the stored charges while the first integrating section is storing the charges.

4. The test apparatus according to claim 1, further comprising a system control device that executes a measuring program for measuring the current flowing through the wire, the system control device comprising the search section configured to repetitively vary the predetermined reference current value from test to test to determine the absolute value of the detected current.

5. The test apparatus according to claim 1, wherein the integrating section further includes:
   an offset correcting section that corrects an offset occurring at an input of the integrating circuit.

6. The test apparatus according to claim 5, wherein
   the current detecting section includes an input switching section that selects either (i) a detection input that detects a current flowing through the wire or (ii) a correction input that is equivalent to an input causing the current flowing through the wire to be zero,
   the integrating section further includes:
   a reference current source that outputs the reference current from an input of the integrating circuit; and
   a reference switching section that selects whether a reference input of the reference current source is connected to a reference voltage or to a ground voltage,
   the offset correcting section includes a correction capacitor that stores an offset error voltage output by the current detecting section in the correction capacitor, when the input switching section selects the correction input and the reference switching section selects the ground voltage, and
   the offset correcting section outputs a voltage equal to −1 times the offset error voltage stored in the correction capacitor, when the input switching section selects the detection input and the reference switching section selects the reference voltage.

7. The test apparatus according to claim 6, wherein
   the judging section includes an offset holding section that holds the offset occurring at an output of the integrating circuit, when the input switching section selects the correction input and the reference switching section selects the ground voltage, and
   the judging section judges whether the device under test is defective based on the offset voltage held by the offset holding section, when the input switching section selects the detection input and the reference switching section selects the reference voltage.

8. The test apparatus according to claim 7, further comprising a low-voltage amplifying section that amplifies the integration value and supplies the amplified integration value to the judging section.

9. The test apparatus according to claim 1, further comprising an AD converting section that measures the integration value, wherein the AD converting section includes:
   a recording section that records digital values obtained by measuring the integration value for each measurement cycle; and
   a processing section that scales the digital values obtained respectively for each measurement cycle recorded on the recording medium with measured values obtained when only the reference current is input before or after a series of measurements.

10. The test apparatus according to claim 1, further comprising a second capacitor that is arranged between the wire and the common potential in series at a location closer to the device under test than the first capacitor is, and has capacitance smaller than that of the first capacitor, wherein
    the current detecting section detects the current flowing through the wire at a location farther from the device under test than the second capacitor is.

11. The test apparatus according to claim 10 wherein
    the judging section judges whether the device under test is a pass or a failure according to whether the integration value is positive or negative.

12. The test apparatus according to claim 11, wherein
    the integrating section includes an integrating circuit that stores charges corresponding to a current indicating the difference between the current detected by the current detecting section and the reference current in a capacity element, and outputs an integration voltage that occurs across both ends of the capacity element as the integration value.

13. The test apparatus according to claim 12, wherein the integrating section further includes a discharging section that discharges the charges stored in the integrating circuit prior to a test.

14. A measurement apparatus for measuring a current flowing through a load, comprising:
- a first capacitor that is arranged between a wire for supplying a voltage to the load and a common potential in series;
- a current detecting section that detects a current flowing through the wire at a location closer to the load than the first capacitor is;
- an integrating section that outputs an integration value obtained by integrating a difference between the current detected by the current detecting section and a predetermined reference current; and
- a search section that repetitively varies the predetermined reference current value from test to test to determine an absolute value of the detected current,
- wherein the search section initially sets the predetermined reference current to a center value of a measurement range of current values to be measured,
- wherein, upon each judgment of whether the detected current value exceeds the predetermined reference current, it is determined whether the detected current is in an upper range or a lower range of the measurement range, upon the determination the determined upper or lower range is set as a new measurement range, and a new predetermined reference current is set as the center value of the new measurement range,
- wherein the search section repeats the setting process a plurality of times to narrow the range and determine the absolute value of the current flowing through the wire.

* * * * *